US009064820B2

(12) United States Patent
Jitjongruck et al.

(10) Patent No.: US 9,064,820 B2
(45) Date of Patent: Jun. 23, 2015

(54) METHOD AND ENCAPSULANT FOR FLIP-CHIP ASSEMBLY

(71) Applicants: Mektec Manufacturing Corporation (Thailand) Ltd, Ayutthaya (TH); Chulalongkorn University, Bangkok (TH)

(72) Inventors: Sathid Jitjongruck, Ayutthaya (TH); Anongnat Somwangthanaroj, Bangkok (TH)

(73) Assignees: MEKIEC MANUFACTURING CORPORATION (THAILAND) LTD, Ayutthaya (TH); CHULALONGKORN UNIVERSITY, Bangkok (TH)

( * ) Notice: Subject to any disclaimer, the term of this patent is extended or adjusted under 35 U.S.C. 154(b) by 0 days.

(21) Appl. No.: 14/390,982

(22) PCT Filed: Apr. 5, 2013

(86) PCT No.: PCT/TH2013/000016
§ 371 (c)(1),
(2) Date: Oct. 6, 2014

(87) PCT Pub. No.: WO2013/165323
PCT Pub. Date: Nov. 7, 2013

(65) Prior Publication Data
US 2015/0054154 A1 Feb. 26, 2015

(30) Foreign Application Priority Data
Apr. 5, 2012 (TH) .................. 1201001607

(51) Int. Cl.
H01L 21/44 (2006.01)
H01L 23/48 (2006.01)
(Continued)

(52) U.S. Cl.
CPC .......... *H01L 23/3142* (2013.01); *H01L 21/563* (2013.01); *H01L 23/295* (2013.01); *H01L 24/17* (2013.01); *H01L 24/81* (2013.01);
(Continued)

(58) Field of Classification Search
CPC ........... H01L 2924/01078; H01L 2924/01079; H01L 2924/01029; H01L 2924/01013
USPC ................. 438/613–614, 612, 617, 106–109, 438/112–113, 127, 124; 257/737–738, 788, 257/781, 784, 780
See application file for complete search history.

(56) References Cited

U.S. PATENT DOCUMENTS

| 5,349,500 A | 9/1994 | Casson et al. |
| 5,390,082 A | 2/1995 | Chase et al. |

(Continued)

Primary Examiner — Hoa B Trinh
(74) Attorney, Agent, or Firm — Novick, Kim & Lee, PLLC; Jae Youn Kim

(57) ABSTRACT

A method of forming an assembly of a substrate and a flip-chip having solder balls thereon, the method having steps of: placing the flip chip with the solder balls in contact with the substrate to form a first interim assembly at a first predetermined temperature; providing an encapsulant to the first interim assembly to form a second interim assembly at a second predetermined temperature that is lower than a melting temperature of the solder balls and higher than the first predetermined temperature; and subjecting the second interim assembly to an environment of a third predetermined temperature that is sufficient to melt the solder balls. An encapsulant for use in forming an assembly of a substrate and a flip-chip having solder balls thereon, the encapsulant consisting essentially of: an epoxy resin; an anhydride curing agent; a fluxing agent having a hydroxyl (—OH) group; and an inorganic filler.

19 Claims, 3 Drawing Sheets

(51) Int. Cl.
*H01L 23/31* (2006.01)
*H01L 21/56* (2006.01)
*H01L 23/29* (2006.01)
*H01L 23/00* (2006.01)

(52) U.S. Cl.
CPC ............... *H01L2224/81024* (2013.01); *H01L 2224/81048* (2013.01); *H01L 2224/81095* (2013.01); *H01L 2224/81815* (2013.01); *H01L 2924/20105* (2013.01); *H01L 2924/20106* (2013.01); *H01L 2924/05432* (2013.01); *H01L 2924/0665* (2013.01); *H01L 2224/16113* (2013.01); *H01L 2224/16227* (2013.01); *H01L 2224/17151* (2013.01)

(56) References Cited

U.S. PATENT DOCUMENTS

| | | |
|---|---|---|
| 5,670,826 A | 9/1997 | Bessho et al. |
| 6,121,689 A * | 9/2000 | Capote et al. ............ 257/783 |
| 6,180,696 B1 | 1/2001 | Wong et al. |
| 6,510,976 B2 | 1/2003 | Hwee et al. |
| 6,617,195 B1 | 9/2003 | Master et al. |
| 6,943,058 B2 | 9/2005 | Chaudhuri et al. |
| 2003/0124378 A1 | 7/2003 | Konarski et al. |
| 2007/0131141 A1* | 6/2007 | Masatoki et al. ....... 106/287.16 |
| 2011/0241228 A1 | 10/2011 | Enomoto et al. |

\* cited by examiner

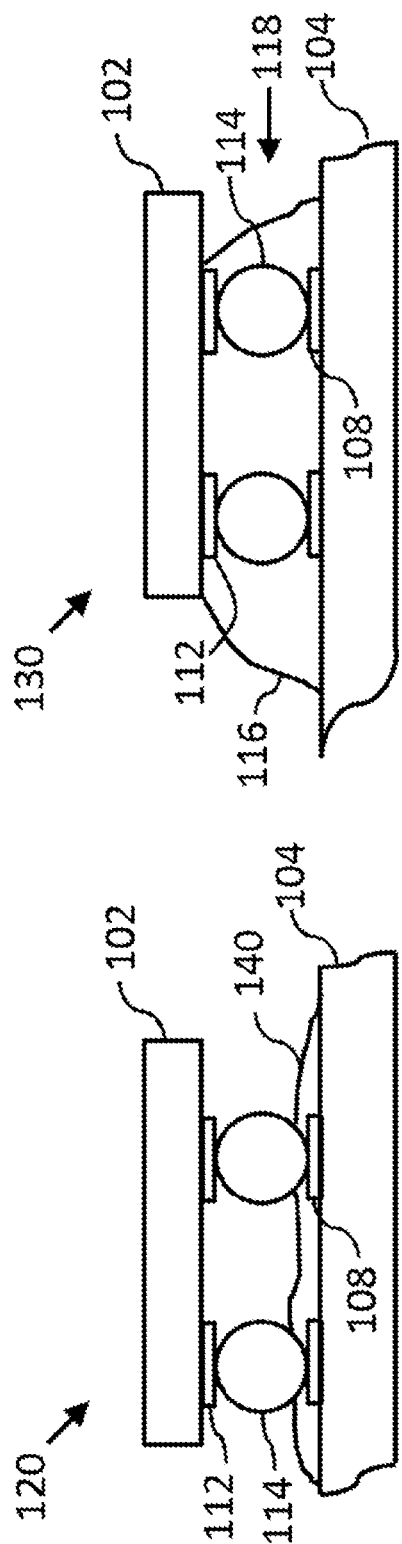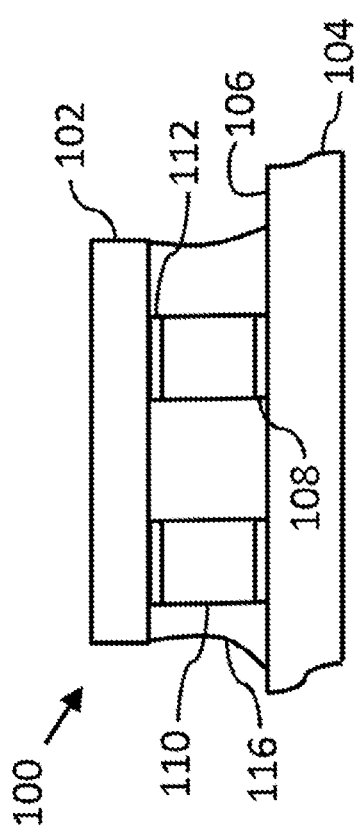

METHOD AND ENCAPSULANT FOR FLIP-CHIP ASSEMBLY

FIELD OF TECHNOLOGY

The present disclosure relates generally to methods and encapsulants for flip-chip assemblies, and in particular to forming flip-chip assemblies requiring only one heating cycle.

BACKGROUND

In the fabrication of flip-chip microelectronic assemblies, it is conventional to use a capillary flow underfill process which involves first making a circuit board by applying a fluxing agent onto a substrate, following with a placement of the flip-chips having solder balls on the substrate, and subjecting the assembly to a first heating cycle to melt the solder balls, so as to create operable interconnections between the substrate and the electronic elements in the flip-chips electronic elements. A circuit board having flip-chips connected to the substrate is thereby formed. An underfill or adhesive material is introduced only after the interconnections (or after the circuit board) has been fabricated. This typically involves a further step of applying the adhesive material along the circuit board and allowing the adhesive material to flow into the spaces between the solder interconnections by capillary forces. The circuit board with the adhesive material disposed thereon is then subjected to a second heating cycle to as to cure the adhesive material, i.e., to cause cross-linked network bonding within the adhesive material domain, but not to cause melting of the solder lest the interconnections formed during the first heating cycle are damaged. As can be appreciated, in one process of making a flip-chip assembly, two heating cycles are required. Since each heating cycle requires time for the temperature to be elevated to a desired level and time for cooling, there is a strong need to increase the efficiency of the flip-chip assembly process in terms of cutting down the production time and reducing the energy consumed.

As a result, there have been efforts to develop one-cycle heating processes, such as the hybrid no-flow process or the no-flow underfill process.

Michael Colella and Daniel Baldwin (Proceedings of the Electronic Components and Technology, IEEE conference 2004) disclosed no-flow processes involving one-cycle heating in which a reflow encapsulant material that exhibits fluxing underfill material properties is introduced to the substrate before placement of the flip-chips on the substrate. It is observed that in such processes, correct placement of the solder balls relative to the contact pads or terminals on the substrate is a problem, and proper connections between the substrate and the flip-chips are not formed.

The U.S. Pat. No. 6,943,058 B2 discloses another approach of achieving one-cycle heating by proposing a no-flow underfill material that initially comprises a dielectric polymer material and a precursor capable of forming an inorganic filler. The flip-chip or component is placed on the substrate after the underfill material is dispensed over terminals on a substrate (Col 3 ln 1-8). Similar issues such as incorrect placement of the flip-chips and a lack of connection between the flip chips and the substrate are observed.

There remains therefore a need for an improved method of forming flip-chip assemblies with improved production yields, i.e., less likelihood of inadequate interconnection between the flip-chips and the substrate leading to failure of the microelectronic product as a whole. At the same time, there is a pressing need for more efficient processes that require less time for the completion of the flip-chip assembly. Further, consistent with the spirit of environment-friendly manufacturing, there is a need to reduce the amount of energy consumed in the production of flip-chip assemblies.

SUMMARY

In accordance with one aspect of the present disclosure, a method of forming an assembly of a substrate and a flip-chip having solder balls thereon includes placing the flip chip with the solder balls in contact with the substrate to form a first interim assembly at a first predetermined temperature; providing an encapsulant material of the present disclosure to the first interim assembly to form a second interim assembly at a second predetermined temperature that is lower than a melting temperature of the solder balls and at least as high as the first predetermined temperature; and subjecting the second interim assembly to an environment of a third predetermined temperature that is sufficient to melt the solder balls.

In some embodiments, the method described above further includes a step of providing a first fluxing agent to at least one of the substrate and the solder balls, prior to the placing step. The step of providing the first fluxing agent can be effected by immersing the solder balls in the fluxing agent, or by applying the fluxing agent to the substrate.

The method of forming an assembly of a substrate and a flip-chip having solder balls thereon can be characterized in that the solder balls are not melted before the subjecting step. The assembly is formed in one heating cycle having a temperature profile having a preheat period; a heat soak period immediately following the preheat period; and a reflow period immediately following the heat soak period.

The present disclosure also relates to a reflow encapsulant material that can include an epoxy resin that can be cured by heat, an anhydride curing compound, a catalyst, a fluxing agent, and an inorganic additive/inorganic filler. The epoxy resin can include a cycloaliphatic epoxy resin, a bisphenol epoxy resin, an epoxy novolac resin, a biphenyl epoxy resin, a naphthalene epoxy resin, a dicyclo pentadiene phenol epoxy resin or a combination of one or more thereof. The fluxing agent can have a hydroxyl group thereby allowing the fluxing agent to react with the anhydride curing compound to flux oxide from solder bumps during normal reflow conditions. In embodiments, if the fluxing agent of the present disclosure is not incorporated into the reflow encapsulant material, the solder bumps will not be reflowed when connecting an electronic device and a substrate. The catalyst can be a metal acetylacetonate, metal acetate or combination thereof. The inorganic additive/inorganic filler can be alumina nanoparticles, wherein the use of alumina nanoparticles improves the properties of the reflow encapsulant material for application in packaging of electronic products.

The present disclosure further relates to an improved adhesive material that can be used when arc welding an electronic device and a substrate, wherein the thermal properties (i.e., both the glass transition temperature and thermal expansion coefficient) of the adhesive material are suitable for application of the adhesive encapsulant material in packaging of electronic products.

According to an aspect of the present disclosure there is provided an encapsulant material that can include: an epoxy resin; an anhydride curing compound; a catalyst; a fluxing agent; and a nanoscale inorganic additive/inorganic filler.

According to another aspect of the present disclosure there is provided an encapsulant material that can consist essentially of: an epoxy resin; an anhydride curing compound; a catalyst; a fluxing agent; and a nano scale inorganic additive/inorganic filler.

According to another aspect of the present disclosure there is provided an encapsulant material that can include: an epoxy resin; an anhydride curing agent; a fluxing agent having a hydroxyl (—OH) group; and an inorganic filler. According to another aspect of the present disclosure there is provided an encapsulant material that can consist essentially of: an epoxy resin; an anhydride curing agent; a fluxing agent having a hydroxyl (—OH) group; and an inorganic filler. The epoxy resin can be selected from the group consisting of cycloaliphatic epoxy, bisphenol A epoxy, bisphenol F epoxy, epoxy novolac, biphenyl epoxy, naphthalene epoxy, dicyclopentadiene-phenol epoxy, and combinations thereof. The anhydride curing agent can be selected from the group consisting of hexahydrophthalic anhydride, methyl hexahydrophthalic anhydride, and combinations thereof. The fluxing agent can be glycerol. The inorganic filler can be alumina. In some embodiments, the encapsulant material further includes a catalyst selected from the group consisting of metal acetylacetonate and metal acetate, and in which the metal ion is selected from the group consisting of $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, and $Mg^{2+}$.

According to another aspect of the present disclosure there is provided an encapsulant material that can consist of: an epoxy resin; an anhydride curing compound; a catalyst; a fluxing agent; and a nanoscale inorganic additive/inorganic filler.

According to yet another aspect of the present disclosure there is provided a method of preparing the encapsulant material described above, wherein the method can include: providing an epoxy resin; providing an anhydride curing compound; providing a catalyst; providing a fluxing agent; providing a nanoscale inorganic additive/inorganic filler; and combining the epoxy resin, anhydride curing compound, catalyst, fluxing agent and nanoscale inorganic additive/inorganic filler.

In embodiments, the epoxy resin of the encapsulant material described above can be a cycloaliphatic epoxy resin, a bisphenol A epoxy resin, a bisphenol F epoxy resin, an epoxy novolac resin, a biphenyl epoxy resin, a naphthalene epoxy resin, a dicyclo pentadiene phenol epoxy resin and a combination of one or more thereof.

In embodiments, the epoxy resin of the encapsulant material described above can be a mixture of a bisphenol A epoxy resin and a cycloaliphatic epoxy resin or a mixture of a bisphenol F epoxy resin and a cycloaliphatic epoxy resin.

In embodiments, the ratio of the bisphenol A epoxy resin to the cycloaliphatic epoxy resin can be about 1:3 to about 3:1. In embodiments, the ratio of the bisphenol F epoxy resin to the cycloaliphatic epoxy resin can be about 1:3 to about 3:1.

In embodiments, the ratio of the bisphenol A epoxy resin to the cycloaliphatic epoxy resin can be about 2:1. In embodiments, the ratio of the bisphenol F epoxy resin to the cycloaliphatic epoxy resin can be about 2:1.

In embodiments, the epoxy resin of the encapsulant material can be a mixture of a bisphenol A epoxy resin and a cycloaliphatic epoxy resin, wherein the bisphenol A epoxy resin is present in an amount of about 35.7% by weight of the encapsulant material and the cycloaliphatic epoxy resin is present in an amount of about 17.6% by weight of the encapsulant material.

In embodiments, the anhydride curing compound of the encapsulant material described above can be a hexahydrophthalic anhydride, a methylhexahydrophthalic anhydride or a combination of one or more thereof. In embodiments, the anhydride curing compound can be 4-methylhexahydrophthalic anhydride.

In embodiments, the anhydride curing compound can be present in an amount of about 20 grams to about 80 grams per about 100 grams of the epoxy resin. In embodiments, the anhydride curing compound can be present in an amount of about 65 grams per about 100 grams of the epoxy resin. In embodiments, the anhydride curing compound can be present in an amount of about 65% by weight of the epoxy resin. In embodiments, the ratio of the anhydride curing compound to the epoxy resin can be about 2:3. In embodiments, the anhydride compound can be present in an amount of about 34.5% by weight of the encapsulant material. These values are based on an uncured epoxy resin.

In embodiments, the catalyst of the encapsulant material described above can be a metal acetylacetonate, a metal acetate or a combination of one or more thereof.

In embodiments, the metal of the metal acetylacetonate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof. In embodiments, the metal acetate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof. In embodiments, the catalyst can be cobalt (II) acetylacetonate.

In embodiments, the catalyst can be present in an amount of about 0.2 grams to about 5.0 grams per about 100 grams of the epoxy resin. In embodiments, the catalyst can be present in an amount of about 1.0 gram to about 1.5 grams per about 100 grams of the epoxy resin. In embodiments, the catalyst is present in an amount of about 1.4 grams per about 100 grams of the epoxy resin. In embodiments, the catalyst can be present in an amount of about 1.4% by weight of the epoxy resin. In embodiments, the catalyst can be present in an amount of about 0.7% by weight of the encapsulant material. These values are based on an uncured epoxy resin.

In embodiments, the fluxing agent of the encapsulant material described above can be a fluxing agent having a hydroxyl group. In embodiments, the fluxing agent having a hydroxyl group can be ethylene glycol, propylene glycol, glycerol, glycerol D-ribose, diethylene glycol or a combination of one or more thereof. In embodiments, the fluxing agent having a hydroxyl group can be glycerol.

In embodiments, the fluxing agent can be present in an amount of about 1 gram to about 15 grams per about 100 grams of the epoxy resin. In embodiments, the fluxing agent can be present in an amount of about 8 grams per about 100 grams of the epoxy resin. In embodiments, the fluxing agent can be present in an amount of about 8% by weight of the epoxy resin. In embodiments, the fluxing agent can be present in an amount of about 4.3% by weight of the encapsulant material. These values are based on an uncured epoxy resin.

In embodiments, the nanoscale inorganic additive/inorganic filler of the encapsulant material described above can be nanoscale alumina including alumina nanoparticles.

In embodiments, the alumina nanoparticles can have an average particle size of about 800 nanometers or less. In embodiments, the alumina nanoparticles can have an average particle size of about 50 nanometers or less.

In embodiments, the alumina nanoparticles can be present in an amount of about 1 gram to about 30 grams per about 100 grams of the epoxy resin. In embodiments, the alumina nanoparticles can be present in an amount of about 10 grams to about 15 grams per about 100 grams of the epoxy resin. In embodiments, the alumina nanoparticles can be present in an amount of about 13.6 grams per about 100 grams of the epoxy resin. In embodiments, the alumina nanoparticles can be present in an amount of about 13.6% by weight of the epoxy resin. In embodiments, the alumina nanoparticles can be present in an amount of about 7.2% by weight of the encapsulant material. These values are based on an uncured epoxy resin.

In embodiments, the encapsulant material described above can be a reflow encapsulant material.

According to yet another aspect of the present disclosure there is provided a microelectronic product comprising an assembly of a substrate and a flip chip having solder balls thereon, the assembly being made by a process comprising the steps of: placing the flip chip with the solder balls in contact with the substrate to form a first interim assembly at a first predetermined temperature; providing an encapsulant material of the present disclosure as described above to the first interim assembly to form a second interim assembly at a second predetermined temperature that is lower than a melting temperature of the solder balls and higher than the first predetermined temperature; and subjecting the second interim assembly to an environment of a third predetermined temperature that is sufficient to melt the solder balls.

The encapsulant material of the present disclosure can be used in conventional processes for fabricating flip-chip microelectronic assemblies. However, in contrast to conventional encapsulant materials, the encapsulant material of the present disclosure can also be effectively used in the method or process of forming an assembly of a substrate and a flip-chip having solder balls thereon of the present disclosure.

In particular, the encapsulant material of the present disclosure is the only encapsulant material that can be effectively used in the method or process of forming an assembly of a substrate and a flip-chip having solder balls thereon of the present disclosure. On the other hand, conventional encapsulant materials cannot be used in the method or process of forming an assembly of a substrate and a flip-chip having solder balls thereon of the present disclosure.

The inventors' patent application entitled "Encapsulant Materials and a Method of Making Thereof" having the same filing date as the present patent application is incorporated herein by reference in its entirety.

BRIEF DESCRIPTION OF DRAWINGS

FIGS. 1A-1C are schematic cross-sectional views showing a first interim flip-chip assembly, a second flip-chip assembly, and a flip-chip assembly in the fabrication of a microelectronic product according to one embodiment of the present disclosure.

DETAILED DESCRIPTION

Figure 2:
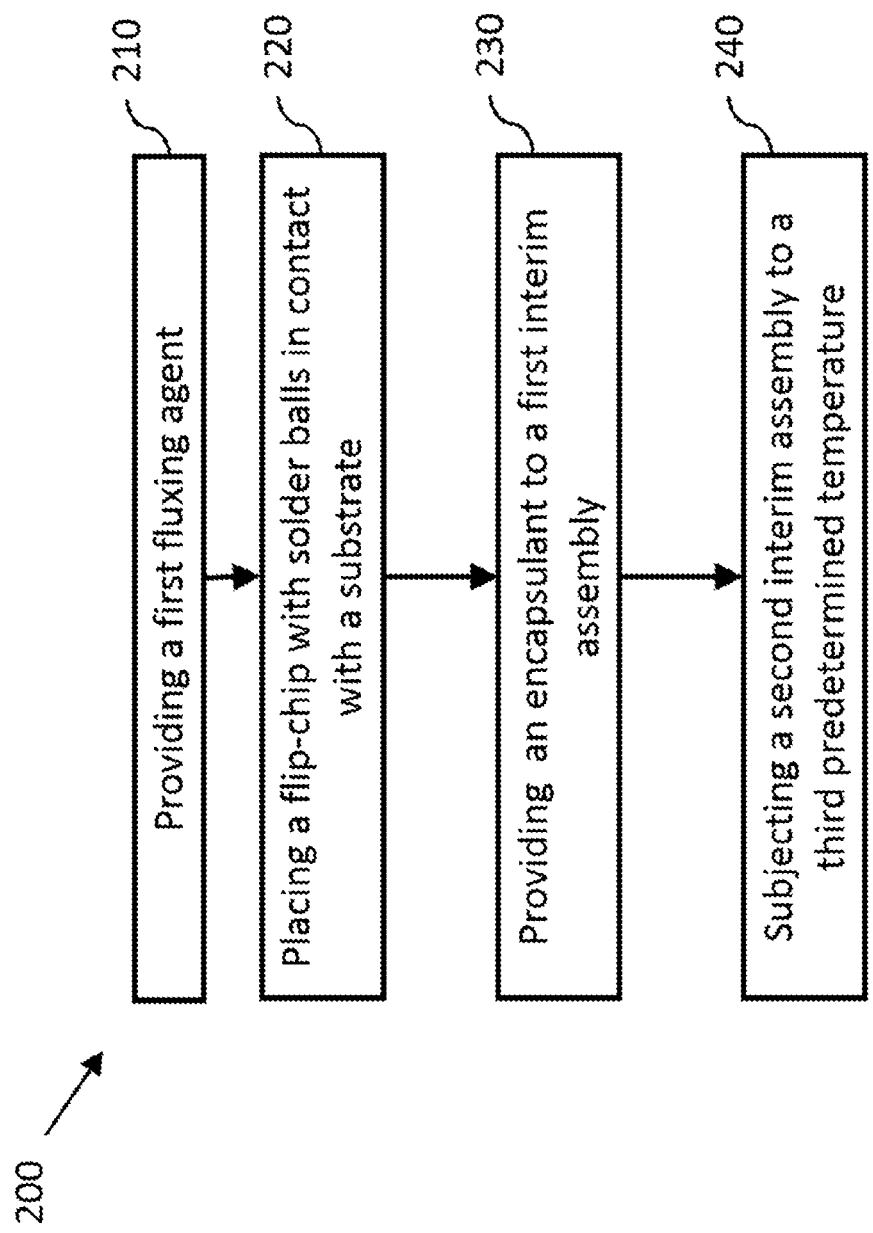
FIG. 2 is a flow-chart showing a method to form a flip-chip assembly according to the embodiment of FIG. 1.

The illustrative embodiments described in the following detailed description and claims are not meant to be limiting. Other embodiments can be utilized, and other modifications can be made, without departing from the spirit or scope of the subject matter presented herein.

Unless specified otherwise, the terms "comprising" and "comprise" as used herein, and grammatical variants thereof, are intended to represent "open" or "inclusive" language such that they include recited elements but also permit inclusion of additional, un-recited elements.

As used herein, the term "about", in the context of amounts of components of formulations, conditions, other measurement values, etc., means +/−5% of the stated value, or +/−4% of the stated value, or +/−3% of the stated value, or +/−2% of the stated value, or +/−1% of the stated value, or +/−0.5% of the stated value, or +/−0.4% of the stated value, or +/−0.3% of the stated value, or +/−0.2% of the stated value, or +/−0.1% of the stated value, or +/−0% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

FIG. 1A-1C are schematic cross-sectional views showing various steps in the fabrication of a microelectronic product according to one embodiment of the present disclosure. The microelectronic product, of which a flip-chip assembly 100 is one example, includes one or more flip-chips 102 mounted to a circuit board 104. The circuit board 104 can be a substrate having at least surface 106 on which conductive paths or circuit traces (not shown) are provided. In the following, the terms "substrate" and "circuit board" are therefore used interchangeably, and can refer to either rigid or flexible substrates. The conductive paths include contact pads or terminals 108 patterned to facilitate solder connection or interconnections 110 with corresponding contacts 112 of a chip.

A satisfactory or operable interconnection between the flip-chip requires a conductive path 110 between respective contacts of the flip-chip and terminals of the substrate via the channels of solder. Each channel of solder is formed by melting a solder ball 114 originally disposed on the flip-chip 102. The melting of the solder balls to form channels of solder is preferably in a manner where the solder flows in a fillet manner, that is to say, where a solder ball upon melting forms a continuous conductive path from a contact 112 of the flip-chip to a terminal 108 of the substrate without intermediate voids or air pockets that may render the column of solder less conductive or non-conductive. Further, to promote an operable flip-chip assembly, it is desirable to have a non-conductive material 116 between the channels of solder, as well as surrounding the channels of solder. It is found that the presence of voids or air pockets in the non-conductive material is detrimental to the formation of operable interconnections between the flip-chip and the substrate.

In a factory or mass production environment, the method according to embodiments of the present disclosure may be performed with numerous units of partially-completed or fully-completed flip-chip assemblies being carried on a conveyor system through a series of stations such that multiple units may be worked on concurrently, the stations being configurable to perform various predetermined steps leading towards the completion of the units. However, solely for convenience and to facilitate understanding, the following description will be made with reference to a flip-chip assembly having a flip-chip and a substrate.

FIG. 2 is a flow chart of a method to form a flip-chip assembly 100 according to one embodiment of the present disclosure. The method involving a novel encapsulant material requires no more than one heating cycle to form operable interconnections between a flip-chip and a substrate (or circuit board).

According to one embodiment of the proposed method 200, there is a step 210 of providing a first fluxing agent 140 prior to a placing step 220. The first fluxing agent is a mixture of an alcohol and a resin, for the purpose of serving as a metal oxide remover. One example of a commercially available chemical that can be selected for use as the first fluxing agent is TSF-6522RH available from Kester. The first fluxing agent can be provided to the substrate or it can be provided to the solder balls of the flip-chip. In the latter case, the flip-chip is held with its solder balls facing downwards, and the solder balls are immersed in a bath of the first fluxing agent, and then the solder balls are removed from the bath. Alternatively described, the solder balls are dipped in a first fluxing agent. In the case where the first fluxing agent is provided to the substrate, the first fluxing agent can be applied across the surface of the substrate intended to receive the solder balls of the flip-chip.

In the placing step 220, the flip-chip 102 with solder balls 114 thereon is placed on the substrate. The solder balls are preferably made of lead-free solder. The flip-chip 102 may be carried by a vacuum tool or end-effector of a robotic arm or a pick-and-place mechanism controllable by a programmable computer. The flip-chip 102 is placed such that the solder balls 114 are in contact with predetermined terminals 108 on the conductive paths found on the substrate 104 to form a first interim assembly 120. The making of the first interim assembly 120 is carried out at a first predetermined temperature 310 that can be the same or higher than ambient temperature, but lower than a temperature at which the solder balls will begin to flow or melt.

Next, in an encapsulant material providing step 230, an encapsulant material is provided to the first interim assembly 120 to form a second interim assembly 130. According to one embodiment of the present disclosure, a novel encapsulant material is proposed for use in a method 200 for forming a flip-chip assembly 100.

In embodiments, the encapsulant material can consist essentially of: an epoxy resin; an anhydride curing agent; a fluxing agent having a hydroxyl (—OH) group; and an inorganic filler. The epoxy resin can be selected from the group consisting of cycloaliphatic epoxy, bisphenol A epoxy, bisphenol F epoxy, epoxy novolac, biphenyl epoxy, naphthalene epoxy, dicyclopentadiene-phenol epoxy, and combinations thereof. The anhydride curing agent can be selected from the group consisting of hexahydrophthalic anhydride, methyl hexahydrophthalic anhydride, and combinations thereof. In embodiments, the fluxing agent is preferably glycerol. In embodiments, the inorganic filler is alumina. In some embodiments, the encapsulant material further includes a catalyst selected from the group consisting of metal acetylacetonate and metal acetate, and in which the metal ion is selected from the group consisting of $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, and $Mg^{2+}$.

In embodiments, the encapsulant material can include an epoxy resin, a curing agent, a catalyst, a fluxing agent, and an inorganic additive/inorganic filler.

In embodiments, the epoxy resin of the encapsulant material can be a cycloaliphatic epoxy resin, a bisphenol A epoxy resin, a bisphenol F epoxy resin, a naphthalene epoxy resin, a dicyclopentadiene-phenol epoxy resin or a combination of one or more thereof. In embodiments, the epoxy resin can be a mixture of different epoxy resins, wherein such a mixture of epoxy resins can support or facilitate the control of curing kinetics, which allows the reflow encapsulant material of the present disclosure to be useful in the packaging of electronic products.

In embodiments, an epoxy resin including a mixture of epoxy resins and having a weight of 100 grams can have one of the epoxy resins present in an amount of about 25 to 75 grams. The remaining amount can include other epoxy resins.

In embodiments, the epoxy resin can include a mixture of diglycidyl ether of bisphenol A and a cycloaliphatic epoxy, such as, 3,4-epoxycyclohexylmethyl 3,4-epoxycyclohexanecarboxylate in the ratio of 1:3 to 3:1. In a preferred embodiment, the epoxy resin can include diglycidyl ether of bisphenol A and 3,4-epoxycyclohexylmethyl 3,4-epoxycyclohexanecarboxylate in a ratio of 2:1. In a preferred embodiment, the epoxy resin of the encapsulant material can be a mixture of diglycidyl ether of bisphenol A and 3,4-epoxycyclohexylmethyl 3,4-epoxycyclohexanecarboxylate, wherein diglycidyl ether of bisphenol A is present in an amount of about 35.7% by weight of the encapsulant material and 3,4-epoxycyclohexylmethyl 3,4-epoxycyclohexanecarboxylate is present in an amount of about 17.6% by weight of the encapsulant material.

In embodiments, the epoxy resin can include diglycidyl ether of bisphenol F mixed with a cycloaliphatic epoxy, such as, 3,4-epoxycyclohexylmethyl 3,4-epoxycyclohexanecarboxylate in the ratio of 1:3 to 3:1. In embodiments, the ratio of the diglycidyl ether of bisphenol F and the cycloaliphatic epoxy, such as, 3,4-epoxycyclohexylmethyl 3,4-epoxycyclohexanecarboxylate can be 2:1. In embodiments, the epoxy resin of the encapsulant material can be a mixture of diglycidyl ether of bisphenol F and 3,4-epoxycyclohexylmethyl 3,4-epoxycyclohexanecarboxylate, wherein diglycidyl ether of bisphenol F is present in an amount of about 35.7% by weight of the encapsulant material and 3,4-epoxycyclohexylmethyl 3,4-epoxycyclohexanecarboxylate is present in an amount of about 17.6% by weight of the encapsulant material.

In embodiments, the curing agent can be an anhydride curing compound such as a hexahydrophthalic anhydride, a methyl hexahydrophthalic anhydride or a combination of one or more thereof. In embodiments, the anhydride curing compound can be present in an amount of about 20 grams to about 80 grams per about 100 grams of the epoxy resin. In embodiments, the anhydride curing compound can be present in an amount of about 65 grams per about 100 grams of the epoxy resin. In embodiments, the anhydride curing compound can be present in an amount of about 65% by weight of the epoxy resin. In embodiments, the ratio of the anhydride curing compound to the epoxy resin can be about 2:3. In embodiments, the anhydride compound can be present in an amount of about 34.5% by weight of the encapsulant material. These values are based on an uncured epoxy resin.

In a preferred embodiment, the curing compound can be 4-methylhexahydrophthalic anhydride. In a preferred embodiment, 4-methylhexahydrophthalic anhydride is present in an amount of about 65 grams per about 100 grams of the epoxy resin. In a preferred embodiment, the 4-methylhexahydrophthalic anhydride compound is present in an amount of about 65% by weight of the epoxy resin. In a preferred embodiment, 4-methylhexahydrophthalic anhydride can be present in an amount of about 34.5% by weight of the encapsulant material. These values are based on an uncured epoxy resin.

In embodiments, the catalyst for the curing process can be a metal acetylacetonate, a metal acetate or a combination of one or more thereof. In embodiments, the metal of the metal acetylacetonate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof.

In embodiments, the metal of the metal acetate can be a metal ion such as $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, $Mg^{2+}$ or a combination of one or more thereof.

In embodiments, the catalyst can be present in an amount of about 0.2 grams to about 5.0 grams per about 100 grams of the epoxy resin. In embodiments, the catalyst can be present in an amount of about 1.0 gram to about 1.5 grams per about 100 grams of the epoxy resin. In embodiments, the catalyst is present in an amount of about 1.4 grams per about 100 grams of the epoxy resin. In embodiments, the catalyst can be present in an amount of about 1.4% by weight of the epoxy resin. In embodiments, the catalyst can be present in an amount of about 0.7% by weight of the encapsulant material.

In a preferred embodiment, the catalyst can be cobalt (II) acetylacetonate. In a preferred embodiment, cobalt (II) acetylacetonate can be present in an amount of about 1.4 grams per about 100 grams of the epoxy resin. In a preferred embodiment, cobalt (II) acetylacetonate can be present in an amount of 1.4% by weight of the epoxy resin. In a preferred embodiment, cobalt (II) acetylacetonate can be present in an amount of about 0.7% by weight of the encapsulant material. These values are based on an uncured epoxy resin.

In embodiments, the fluxing agent can have a hydroxyl group. In embodiments, the fluxing agent having a hydroxyl group can be ethylene glycol, propylene glycol, glycerol D-ribose, diethylene glycol or a combination of one or more thereof.

In embodiments, the fluxing agent amount can affect and/or influence the storage modulus of the encapsulant material of the present disclosure. In embodiments, the fluxing agent can be present in an amount of about 1 gram to about 15 grams per about 100 grams of the epoxy resin. In embodiments, the fluxing agent can be present in an amount of about 3 grams to about 10 grams per about 100 grams of the epoxy resin. In embodiments, the fluxing agent can be present in an amount of about 8 grams per about 100 grams of the epoxy resin. In embodiments, the fluxing agent can be present in an amount of about 8% by weight of the epoxy resin. In embodiments, the fluxing agent can be present in an amount of about 4.3% by weight of the encapsulant material.

In a preferred embodiment, the fluxing agent can be glycerol. In embodiments, the amount of glycerol present in the encapsulant material can affect and/or influence the storage modulus of the encapsulant material of the present disclosure. In a preferred embodiment, glycerol can be present in an amount of about 8 grams per about 100 grams of the epoxy resin. In a preferred embodiment, glycerol can be present in an amount of 8% by weight of the epoxy resin. In a preferred embodiment, glycerol can be present in an amount of about 4.3% by weight of the encapsulant material. These values are based on an uncured epoxy resin.

In embodiments, the inorganic additive/inorganic filler is used for improving the mechanical and thermal properties of the reflow encapsulant material. In embodiments, the inorganic additive/inorganic filler can be a nanoscale inorganic additive/inorganic filler. In embodiments, the nanoscale inorganic additive/inorganic filler of the encapsulant material described above can be alumina nanoparticles. Other inorganic additives/inorganic fillers are also contemplated. Other nanoscale additives/inorganic fillers are also contemplated.

In embodiments, the alumina nanoparticles can have an average particle size of about 800 nanometers or less. In embodiments, the alumina nanoparticles can have an average particle size of about 50 nanometers or less. In a preferred embodiment, the alumina nanoparticles have an average particle size of about 50 nanometers.

In embodiments, the alumina nanoparticle amount can affect and/or influence the glass transition temperature of the encapsulant material of the present disclosure. In embodiments, the alumina nanoparticles can be present in an amount of about 1 gram to about 30 grams per about 100 grams of the epoxy resin. In embodiments, the alumina nanoparticles can be present in an amount of about 10 grams to about 15 grams per about 100 grams of the epoxy resin. In a preferred embodiment, the alumina nanoparticles can be present in an amount of about 13.6 grams per about 100 grams of the epoxy resin. In a preferred embodiment, the alumina nanoparticles can be present in an amount of 13.6% by weight of the epoxy resin. In a preferred embodiment, the alumina nanoparticles are present in an amount of 7.2% by weight of the encapsulant material. These values are based on an uncured epoxy resin.

In embodiments, the viscosity of the encapsulant material of the present disclosure at room temperature can be less than about 8000 cP (centipoise). In embodiments, the viscosity of the encapsulant material at room temperature can be about 3000 cP to about 5000 cP. In embodiments, the viscosity of the encapsulant material at room temperature can be about 2500 cP to about 4100 cP. In embodiments, the viscosity of the encapsulant material at room temperature can be about 4000 cP.

In embodiments, the glass transition temperature of the encapsulant material of the present disclosure can be about 127° C. to about 130° C.

In embodiments, the storage modulus of the encapsulant material of the present disclosure can be about 2 GPa to about 2.4 GPa (at 30° C., 1 Hz).

In accordance with a preferred embodiment of the present disclosure, the encapsulant material can include: a mixture of diglycidyl ether of bisphenol A and 3,4-epoxycyclohexylmethyl 3,4-epoxycyclohexanecarboxylate, wherein diglycidyl ether of bisphenol A is present in an amount of about 35.7% by weight of the encapsulant material and 3,4-epoxycyclohexylmethyl 3,4-epoxycyclohexanecarboxylate is present in an amount of about 17.6% by weight of the encapsulant material; 4-methylhexahydrophthalic anhydride present in an amount of about 34.5% by weight of the encapsulant material; cobalt (II) acetylacetonate present in an amount of about 0.7% by weight of the encapsulant material; glycerol in an amount of about 4.3% by weight of the encapsulant material; and alumina nanoparticles present in an amount of 7.2% by weight of the encapsulant material. An encapsulant material having the above mentioned components in the above mentioned amounts results in an improved adhesive encapsulant material having a glass transition temperature of about 130° C., a thermal expansion coefficient or coefficient of thermal expansion of about 53.23 ppm/° C., a viscosity of about 4100 cP (at room temperature), a loss modulus of about 90 MPa (at 30° C., 1 Hz) and/or a storage modulus of about 2.4 GPa (at 30° C., 1 Hz) that are suitable and/or advantageous for application of the adhesive encapsulant material in the packaging of electronic products. A reflow encapsulant material having the above mentioned components in the above mentioned amounts results in an unexpected and surprising synergy of thermal properties (i.e., glass transition temperature and coefficient of thermal expansion) and rheological properties (i.e., loss modulus, storage modulus and viscosity) that provide improved results with respect to solder bumps being reflowed and with respect to a substrate and flip-chips effectively attaching.

The glass transition temperature of the encapsulant material of the present disclosure was measured using the Dynamic Mechanical Analysis (DMA) technique. The glass transition temperature value(s) was obtained from tan delta at 1 Hz. The coefficient of thermal expansion of the encapsulant material of the present disclosure was measured using the Thermomechanical Analysis (TMA) technique. The viscosity of the encapsulant material of the present disclosure was measured using a rheometer with a parallel plate fixture at room temperature. The loss modulus of the encapsulant material of the present disclosure was measured using the DMA technique. The storage modulus of the encapsulant material of the present disclosure was measured using the DMA technique.

The loss modulus relates to and/or measures the ability of the encapsulant material of the present disclosure to dissipate energy as heat. The storage modulus relates to and/or measures the elasticity of the encapsulant material of the present disclosure.

In accordance with a preferred embodiment of the present disclosure, the encapsulant material can include: a mixture of diglycidyl ether of bisphenol A and 3,4-epoxycyclohexylmethyl 3,4-epoxycyclohexanecarboxylate, wherein diglycidyl ether of bisphenol A is present in an amount of about 67 grams and 3,4-epoxycyclohexylmethyl 3,4-epoxycyclohexanecarboxylate is present in an amount of about 33 gram; 4-methylhexahydrophthalic anhydride present in an amount of about 65 grams; cobalt (II) acetylacetonate present in an amount of about 1.4 grams; glycerol in an amount of about 8 grams; and alumina nanoparticles present in an amount of 13.6 grams. An encapsulant material having the above mentioned components in the above mentioned amounts results in an improved adhesive encapsulant material having a glass transition temperature of about 130° C., a thermal expansion coefficient or coefficient of thermal expansion of about 53.23 ppm/° C., a viscosity of about 4100 cP (at room temperature), a loss modulus of about 90 MPa (at 30° C., 1 Hz) and/or a storage modulus of about 2.4 GPa (at 30° C., 1 Hz) that are suitable and/or advantageous for application of the adhesive encapsulant material in the packaging of electronic products. A reflow encapsulant material having the above mentioned components in the above mentioned amounts results in an unexpected and surprising synergy of thermal properties (i.e., glass transition temperature and coefficient of thermal expansion) and rheological properties (i.e., loss modulus, storage modulus and viscosity) that provide improved results with respect to solder bumps being reflowed and with respect to a substrate and flip-chips effectively attaching.

The glass transition temperature of the encapsulant material of the present disclosure was measured using the Dynamic Mechanical Analysis (DMA) technique. The glass transition temperature value(s) was obtained from tan delta at 1 Hz. The coefficient of thermal expansion of the encapsulant material of the present disclosure was measured using the Thermomechanical Analysis (TMA) technique. The viscosity of the encapsulant material of the present disclosure was measured using a rheometer with a parallel plate fixture at room temperature. The loss modulus of the encapsulant material of the present disclosure was measured using the DMA technique. The storage modulus of the encapsulant material of the present disclosure was measured using the DMA technique.

The loss modulus relates to and/or measures the ability of the encapsulant material of the present disclosure to dissipate energy as heat. The storage modulus relates to and/or measures the elasticity of the encapsulant material of the present disclosure.

The encapsulant material of the present disclosure can be used in conventional processes for fabricating flip-chip microelectronic assemblies. However, in contrast to conventional encapsulant materials, the encapsulant material of the present disclosure can also be effectively used in the single-stage heating method or process of forming an assembly of a substrate and a flip-chip having solder balls thereon of the present disclosure.

In particular, the encapsulant material of the present disclosure is the only encapsulant material that can be effectively used in the single-stage heating method or process of forming an assembly of a substrate and a flip-chip having solder balls thereon of the present disclosure. On the other hand, conventional encapsulant materials cannot be used in the single-stage heating method or process of forming an assembly of a substrate and a flip-chip having solder balls thereon of the present disclosure.

In general, with conventional encapsulant materials in the art, efforts are typically made to lower the coefficient of thermal expansion and increase the glass transition temperature of the conventional encapsulant material to make the conventional encapsulant material suitable for use in the packaging of electronic products.

In an unexpected and surprising finding, the inventors of the present disclosure discovered that while the coefficient of thermal expansion and the glass transition temperature are important in determining the suitability and effectiveness of an encapsulant material, the loss modulus and storage modulus are also important in determining the suitability and effectiveness of the encapsulant material for use in the packaging of electronic products.

For example, while the coefficient of thermal expansion of the encapsulant material of the present disclosure can be about 53.23 ppm/° C. and the glass transition temperature can be about 127° C. to about 130° C., the unexpected and surprising synergy of these thermal properties with the loss modulus measurement of about 90 MPa (at 30° C., 1 Hz) and the storage modulus measurement of about 2 GPa to about 2.4 GPa (at 30° C., 1 Hz) allows the encapsulant material to be effectively used in both conventional processes and the single-stage heating method or process for fabricating flip-chip microelectronic assemblies of the present disclosure.

The inventors of the present disclosure found that the unexpected and surprising synergy of the thermal properties (i.e., the glass transition temperature and the coefficient of thermal expansion) and the rheological properties (i.e., the loss modulus, the storage modulus and the viscosity) of the reflow encapsulant material of the present disclosure provides the best result with respect to solder bumps being reflowed and the substrate and flip-chips effectively attaching when compared to conventional encapsulant materials.

The inventors' patent application entitled "Encapsulant Materials and a Method of Making Thereof" having the same filing date as the present patent application is incorporated herein by reference in its entirety.

In one embodiment, the encapsulant material is heat-curable and constituted so that at a second predetermined temperature 320, it exhibits a viscosity that facilities a desired flow behavior across the substrate without undergoing curing. In one embodiment, the encapsulant material is heat-curable and constituted so that it is capable of flowing without undergoing curing at a second predetermined temperature 320 that is at least as high as the first predetermined temperature 310. In one embodiment, the encapsulant material is heat-curable and constituted so that it is capable of flowing without undergoing curing at a second predetermined temperature 320 that is not lower than the first predetermined temperature 310. In one embodiment, the encapsulant material is heat-curable and constituted so that it is capable of flowing without undergoing curing at a second predetermined temperature 320 that is between ambient temperature and 120° C. In one embodiment, the encapsulant material is heat-curable and constituted so that it is capable of flowing without undergoing curing at a second predetermined temperature 320 that is about 65° C. In one embodiment, the encapsulant material is heat-curable and constituted so that it is capable of flowing without undergoing curing at a second predetermined temperature that is about ambient temperature. The term "about" is used in the present disclosure to refer to a tolerance or variation of +/−20° C., given that one of ordinary skill in the art would appreciate that extremely accurate temperature measurement or strictly precise temperature conditions is not practical under most manufacturing conditions, and that some variation is unavoidable owing to factors such as different environmental conditions present in different parts of the world, different manufacturing equipment used, and different measurement techniques used.

Continuing with the description of one embodiment of the proposed method, the encapsulant material providing step 230 takes place at a second predetermined temperature 320 that is lower than a melting temperature 382 of the solder balls 114. The second predetermined temperature 320 is selected to be not lower than the first predetermined temperature 310. The second predetermined temperature 320 in one embodiment is about the same as the first predetermined temperature 310. The second predetermined temperature 320 in one embodiment is at least as high as the first predetermined temperature 310. The guiding principle is to provide the encapsulant material 116 to the first interim assembly 120 when the solder balls 114 are substantially in the shape or state similar to their original shape or state when they were originally formed on the flip-chip 102. In other words, the solder balls 114 are not and have not been melted in the flip-chip assembly process 200 prior to the provision of the encapsulant material 230. The first interim assembly 120 therefore is not heated to a temperature at which the solder balls would have melted (or flowed) or started to melt and then cooled before the encapsulant material is provided.

Alternatively described, the encapsulant material 116 is provided to the first interim assembly in which the interconnections 110 between the flip-chip 102 and the substrate 104 have not been formed. In one embodiment, the encapsulant material 116 can be heated separately from the first interim assembly in a dispenser (not shown) before it is dispensed, for example, through a nozzle (not shown) so that the encapsulant material can be observed to start flowing across the substrate 104 between the flip-chip 102 and the substrate 104 once dispensed to the first interim assembly 120. The second predetermined temperature 320 can be the temperature at the nozzle dispensing the encapsulant material 116. Alternatively, the second predetermined temperature 320 can be measured from the encapsulant material 116 as it is dispensed from the nozzle. Alternatively, the second predetermined temperature 320 can be measured from the temperature of the environment or the first interim assembly or a part of the conveyor system carrying the first interim assembly, as is convenient in the specific manufacturing environment.

Capillary forces are believed to be at work, drawing the encapsulant material 116 between neighboring solder balls 114, causing the encapsulant material 116 to fill up the gap or gaps 118 therebetween, and surrounding the solder balls 114. The second predetermined temperature 320 is selected such that the encapsulant material 116 once provided will not be hindered from flowing as soon as it is provided to the first interim assembly, by means of capillary action, between the solder balls 114 and between the flip-chip 102 and the substrate 104. The encapsulant material 116 can be provided in a line along one side of the flip-chip 102, and in flowing across the substrate 104, the encapsulant material 116 is observed to fill the gap or gaps 118 between the flip-chip and the substrate, and between adjacent solder balls.

The second interim assembly 130 is then subjected to heating, for example, by running the conveyor system carrying the second interim assembly 130 through a heatable environment or a tunnel with heating elements provided therein. The environment in the tunnel can be set at a temperature higher such that the second interim assembly reaches the next station at a desired temperature.

In a subjecting step 240, the second interim assembly 130 (that is the first interim assembly 120 with the encapsulant material 116 already provided thereon) is then subjected to an environment of a third predetermined temperature 382 that is sufficient to melt the solder balls 114. The solder balls 114 are not melted before the subjecting step 240. Similarly, the third predetermined temperature may be measured from the temperature of the environment or the second interim assembly or a part of the conveyor system carrying the second interim assembly, as is convenient in the specific manufacturing environment. In the subjecting step 240, the solder balls 114 are melted or caused to flow by the elevated temperature so that interconnections 110 between the flip-chip and the substrate are formed. At the same time, the encapsulant material 116 undergoes curing. Cross-linkages or bonding reactions that result in the formation of cross-linked networks in the encapsulant material 116 occurs. The solder balls 114 are not melted before the subjecting step 240 as the temperature of the first interim assembly 120 (before the encapsulant material 116 is provided) is not elevated to a temperature sufficient to cause the solder balls 114 to melt or flow. In other words, at the subjecting step 240, the solder balls 114 are caused to melt or flow concurrently with a curing or setting of the encapsulant material 116.

When the second interim assembly 130 is cooled, it is observed that interconnections 110 between the flip-chip and the substrate have been formed, with the solder having flowed in a fillet manner and the encapsulant material 116 encapsulating the solder without undesirable voids or air pockets that would render the flip-chip assembly inoperable. The solder balls 114 have formed columns or interconnections 110 of conductive paths between the contacts 112 of the flip-chip and the corresponding terminals 108 of the substrate. The encapsulant material 116 has flowed and cured to form a non-conductive barrier around the solder. In this manner, the flip-chip assembly 100 is formed.

It can be appreciated from the foregoing description that the method 200 according to embodiments of the present disclosure involves no more than one heating cycle in the formation of a flip-chip assembly. In other words, proposed is a "single-stage heating process" enabled by the novel encapsulant material for the forming of a flip-chip assembly 100 that provides savings in both time and energy consumption. Alternatively described, components of the flip-chip assembly (for example, the flip-chip with the solder balls, the encapsulant material, and the substrate) are put together before the whole is subjected to one heating cycle. To better highlight the time-saving and energy-saving advantages of the proposed method, the flip-chip assembly process 200 is described below with reference to a temperature profile 300 as shown in FIG. 3.

Figure 3:
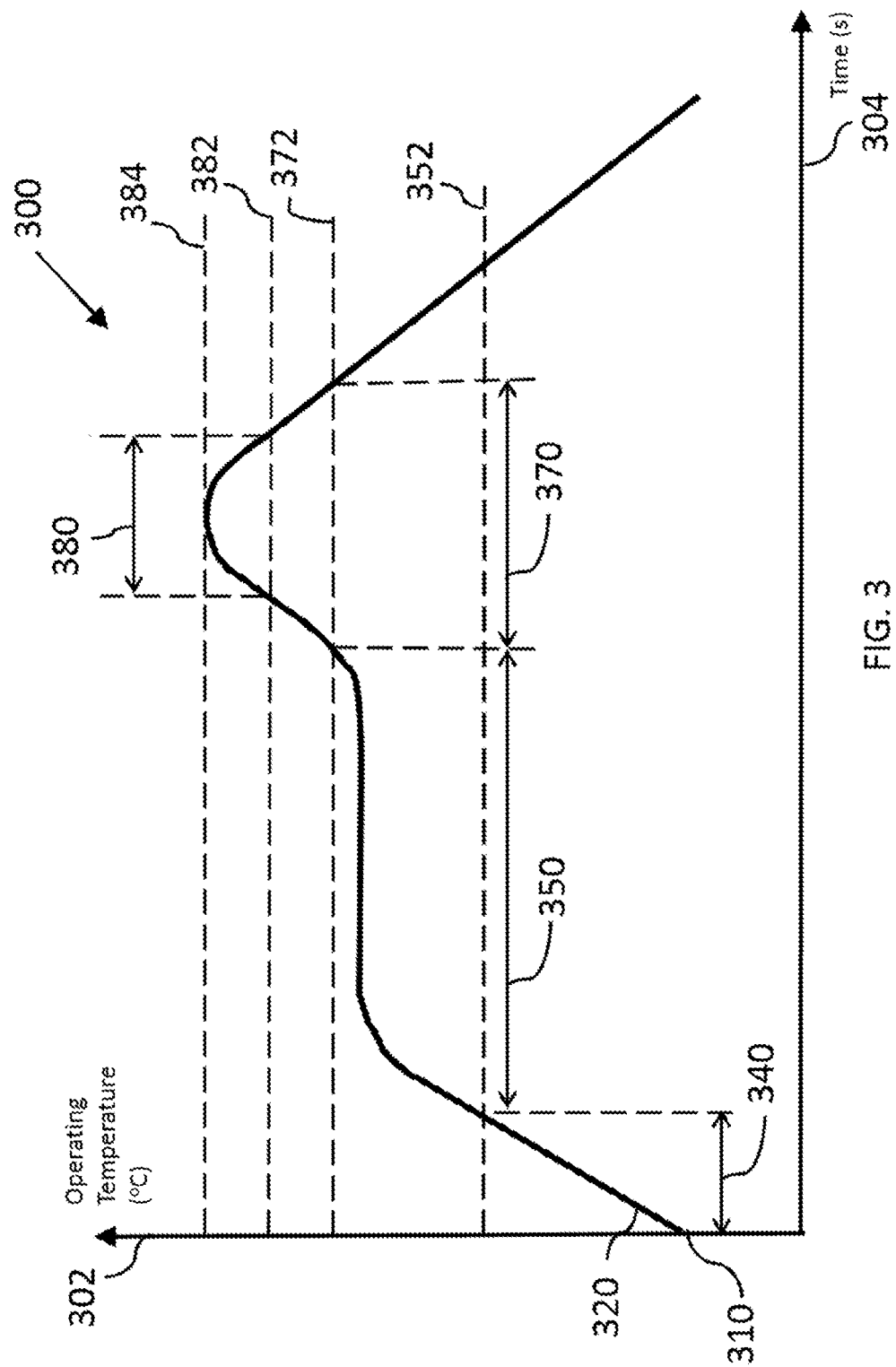
FIG. 3 is a graphical representation (not drawn to scale) of a temperature profile of a single heating cycle according to the embodiment of FIG. 1.

FIG. 3 is a graphical representation of a temperature profile 300 of one heating cycle according to one embodiment of the proposed method in which the operating temperature 302 is plotted against time 304. The operating temperature 302 may be measured by taking the temperature of the environment or the first interim assembly or a part of the conveyor system carrying the first interim assembly, as is convenient or conventional in the specific manufacturing environment. As appropriate or convenient, the operating temperature may be taken from the temperature of a part of the dispenser for providing the encapsulant material 116 (such as the nozzle from which encapsulant material 116 is dispensed) or from the temperature of the encapsulant material 116.

The flip-chip assembly is formed in one heating cycle having a temperature profile with a preheat period 340; a heat soak period 350 immediately following the preheat period 340; and a reflow period 370 following the heat soak period 350.

EXAMPLE A

In one experiment conducted in accordance with embodiments of the present disclosure, the first fluxing agent was provided to the solder balls 114 by immersing the solder balls 114 in a bath of the first fluxing agent such that the first fluxing agent coats or partially coats the solder balls 114 to a thickness of about 35 micrometers. Before or at the beginning of a preheat period 340, or at a first predetermined temperature 310, the flip-chip 102 with solder balls 114 thereon was placed in contact with the substrate 104 in a placing step 220. In this experiment, the first predetermined temperature is ambient temperature. In the placing step 220, a connecting force of about 4 grams-force was applied to each solder ball 114 when placing the flip-chip 102 on the substrate 104, as summarized in Table 1 below.

TABLE 1

Placement/connection conditions.

| | |
|---|---|
| Connecting force | 4 g/solder ball |
| Connecting time | 0 |

TABLE 2

Encapsulant application conditions.

| | |
|---|---|
| Nozzle size | 10 mil |
| Application height | 0.05 inch |
| Application speed | 1 inch/second |
| Pressure | 15 pounds/square inch |
| Base temperature | 100° C. |
| Nozzle temperature | 65° C. |
| Volume | 1.4-2 mg |

The encapsulant material 116 was dispensed after the placement of the solder balls and before, at the beginning of or during the preheat period 340 at a second predetermined temperature 320.

For this experiment, as summarized in Table 2 above, a nozzle with a diameter of 10 mil was used to dispense the encapsulant material 116 from a height of 0.05 inch at a rate of about 1 inch per second. A pressure of about 15 pounds per square inch was provided to deliver the encapsulant material 116. The system for dispensing the encapsulant material 116 was heated to 100° C., and the nozzle temperature was about 65° C. About 1.4 to 2 milligrams of the encapsulant material 116 was dispensed in this experiment. In this experiment, the second predetermined temperature was about 65° C.

In the preheat period 340, heat was applied for 30 to 180 seconds, bringing the operating temperature 302 from ambient or 25 degrees Celsius (° C.) to 150° C. The preheat period 340 occurred after the step 210 in which the first fluxing agent had been provided to either the solder balls 114 or the substrate 104, and after the flip-chip with the solder balls have been placed in contact with the substrate to form the first interim assembly.

Next, in a heat soak period 350, the operating temperature 302 was brought from an initial heat soak temperature 352 of 150° C. to a heat soak temperature 372 of about 217° C. This took 35 to 100 seconds. Towards the end or when operating temperature 302 of the heat soak period 350 reached a heat soak temperature 372. The heat soak period took 35 to 100 seconds.

Next, the flip-chip assembly process 200 entered a reflow period 370 in which the operating temperature 302 was maintained above 217° C. for 45 to 95 seconds. The maximum temperature 384 of the temperature profile 300 was 245° C. During the reflow period 370, cross-linking or network bonding reactions of the encapsulant material occurred. When the operating temperature 302 was raised above a solder melting temperature 382, such as 227° C., the temperature profile 300 shows a solder melting period 380 within the reflow period 370. At this time, the solder balls 114 also melted and formed interconnections 110 between the flip-chip 102 and the substrate 106. The solder melting period 380 may last for 35 to 75 seconds. During the solder melting period 380, the operating temperature may at one time be brought to a maximum temperature 384 of about 235° C. to 245° C.

It was observed that the solder balls 114 of the flip-chip assembly of Example A have melted and flowed in a fillet manner, when a cross-section is taken of the flip-chip assembly 100. No air bubbles or voids were observed around and underneath the flip-chip 102. Evaluation of the flip-chip assembly was further carried out by a thermal shock test in which the specimen (flip-chip assembly) was disposed inside a temperature-controlled compartment and the temperature thereof was configured to cycle between −55° C. and 125° C., with the temperature rising and falling at a rate of 20° C. per minute. It was found that a flip-chip assembly 100 formed according to one embodiment of the proposed method, such as in Example A, can survive more than 1,000 cycles of the thermal shock test. The evaluation results for the flip-chip of Example A therefore speak favorably of the proposed method 200.

Various flip-chip assemblies also were fabricated for the purpose of comparing the results with the flip-chip assembly 100 formed in Example A.

COMPARATIVE EXAMPLE 1

A flip-chip assembly for Comparative Example 1 was formed by first applying a reflow encapsulant on a substrate, and then placing a flip-chip with solder balls on the substrate to form an interim assembly. Subsequently, heat was applied according to the temperature profile of FIG. 3. That is to say, the interim assembly (a flip-chip placed on the substrate with the reflow encapsulant thereon) was subjected to a preheat period for 30 to 80 seconds when the operating temperature was brought from ambient or 25° C. to 150° C. Next, the interim assembly was subjected to a heat soak period of 35 to 100 seconds before it was then put in a reflow period in which the operating temperature was brought above 217° C. for 45 to 95 seconds.

The resulting Comparative Example 1 flip-chip assembly was found to have incomplete interconnections between the flip-chip and the substrate. It was observed that the solder balls had failed to flow in the desired fillet manner, that is to say, a cross-section taken of the flip-chip assembly showed that the solder balls remain spherical in shape and had not melted. Accordingly, the flip-chip of Comparative Example 1 was not subjected to the thermal shock test as it had clearly failed to satisfy visual inspection.

COMPARATIVE EXAMPLE 2

A Comparative Example 2 according to another conventional method was formed in the following manner. A reflow encapsulant was applied to one side of a substrate, and the flip-chip was then placed on the substrate with the solder balls of the flip-chip in contact with the substrate. The parameters and conditions under which the reflow encapsulant was provided and under which the flip-chip was placed on the substrate were similar to those of Tables 1 and 2. After the flip-chip with reflow encapsulant was placed on the substrate to form an interim assembly, the interim assembly was subjected to heating following the temperature profile of FIG. 3. Again, the temperature profile began with a preheat period of 30 to 80 seconds during when the operating temperature was brought from ambient or 25° C. to 150° C. Next followed a heat soak period of 35 to 100 seconds before a reflow period in which the operating temperature was brought above 217° C. for 45 to 95 seconds.

The resulting Comparative Example 2 flip-chip assembly was also found to have incomplete interconnections between the flip-chip and the substrate. It was observed that the solder balls had failed to flow in the desired fillet manner, that is to say, a cross-section taken of the flip-chip assembly showed that the solder balls remain spherical in shape and had not melted. Accordingly, the flip-chip of Comparative Example 2 was not subjected to the thermal shock test as it had clearly failed to satisfy visual inspection.

COMPARATIVE EXAMPLE 3

A Comparative Example 3 flip-chip assembly was formed in the following manner. A first fluxing agent was provided to the solder balls of a flip-chip to a thickness of 35 micrometers. A reflow encapsulant was applied to one side of a substrate, and the flip-chip was then placed on the substrate with the solder balls of the flip-chip in contact with the substrate. The parameters and conditions under which the reflow encapsulant was provided and under which the flip-chip was placed on the substrate were similar to those of Tables 1 and 2. After the flip-chip with reflow encapsulant was placed on the substrate to form an interim assembly, the interim assembly was subjected to heating following the temperature profile of FIG. 3. Again, the temperature profile began with a preheat period of 30 to 80 seconds during when the operating temperature was brought from ambient or 25° C. to 150° C. Next followed a heat soak period of 35 to 100 seconds before a reflow period in which the operating temperature was brought above 217° C. for 45 to 95 seconds.

The resulting Comparative Example 3 flip-chip assembly was found to have incomplete interconnections between the flip-chip and the substrate. It was observed that the solder balls had failed to flow in the desired fillet manner, that is to say, a cross-section taken of the flip-chip assembly showed that the solder balls remain spherical in shape and had not melted. In addition, air bubbles and voids were clearly visible around and underneath the flip-chip. Accordingly, the flip-chip of Comparative Example 3 was not subjected to the thermal shock test as it had clearly failed to satisfy visual inspection.

From the comparative experiment results, it can be appreciated that method proposed in the present disclosure yields unexpectedly superior products over conventional methods, in addition to providing savings in fabrication time and energy consumption.

While features, aspects, and/or advantages associated with certain embodiments have been described in the present disclosure, other embodiments may also exhibit such features, aspects, and/or advantages, and not all embodiments need necessarily exhibit such features, aspects, and/or advantages to fall within the scope of the disclosure. It will be appreciated by a person of ordinary skill in the art that several of the above-disclosed systems, components, processes, or alternatives thereof, may be desirably combined into other different systems, components, processes, and/or applications. For example, the precise operating temperature and time durations for each of the preheat period, the heat soak period, and the reflux period may vary according to the efficiency and condition of the particular conveyor system and heating apparatus used, and according to the size and number of flip-chips to be mounted to the substrate. In addition, various modifications, alterations, and/or improvements may be made to various embodiments that are disclosed by a person of ordinary skill in the art within the scope of the present disclosure, which is limited only by the following claims.

The invention claimed is:

1. A method of forming an assembly of a substrate and a flip-chip having solder balls thereon, the method comprising steps of:
   placing the flip chip with the solder balls in contact with the substrate to form a first interim assembly at a first predetermined temperature, wherein the first predetermined temperature is lower than a melting temperature of the solder balls;
   providing an encapsulant material to the first interim assembly and exposing the provided encapsulant material to a second predetermined temperature at which the encapsulant material flows to surround the solder balls and fill gaps between the solder balls without undergoing curing to thereby form a second interim assembly, wherein the second temperature is lower than a melting temperature of the solder balls and at least as high as the first predetermined temperature, and wherein the solder balls have not been melted prior to the provision of the encapsulant material to the first interim assembly; and
   subjecting the second interim assembly to an environment of a third predetermined temperature that is sufficient to melt the solder balls, wherein the third predetermined temperature is greater than the second predetermined temperature.

2. The method of claim 1, further comprising a step of providing a first fluxing agent to at least one of the substrate and the solder balls, prior to the placing step.

3. The method of claim 2, in which the step of providing the first fluxing agent comprises immersing the solder balls in the fluxing agent or applying the fluxing agent to the substrate.

4. The method of claim 1, wherein the encapsulant material is provided to the first interim assembly when the solder balls are substantially in a state similar to their state when the solder balls were originally formed on the flip chip.

5. The method of claim 1, wherein the solder balls are not melted before the subjecting step, and wherein the solder balls are melted concurrent with curing of the encapsulant material during the subjecting step.

6. The method of claim 1, in which the assembly is formed in one heating cycle having a temperature profile comprising:
   a preheat period;
   a heat soak period immediately following the preheat period; and a reflow period immediately following the heat soak period.

7. The method of claim 6, in which the preheat period is characterized by a continuous increase in temperature from ambient temperature to 150 degrees Celsius.

8. The method of claim 7, in which the preheat period is between 30 seconds to 80 seconds inclusive.

9. The method of claim 6, in which the heat soak period is characterized by a continuous increase in temperature from 150 degrees Celsius to 217 degrees Celsius.

10. The method of claim 9, in which the heat soak period is between 35 seconds to 100 seconds inclusive.

11. The method of claim 6, in which the reflow period is characterized by:
  a continuous increase in temperature from 217 degrees Celsius to a peak temperature of 245 degrees Celsius; and
  a continuous decrease in temperature from the peak temperature to ambient temperature.

12. The method of claim 11, in which the reflow period is characterized by a temperature above 217 degrees Celsius for 45 seconds to 95 seconds.

13. The method of claim 1, in which the encapsulant material provided comprises:
  an epoxy resin;
  an anhydride curing agent;
  a fluxing agent having a hydroxyl (—OH) group; and
  an inorganic filler.

14. The method of claim 13, in which the epoxy resin is selected from the group consisting of cycloaliphatic epoxy, bisphenol A epoxy, bisphenol F epoxy, epoxy novolac, biphenyl epoxy, naphthalene epoxy, dicyclopentadiene-phenol epoxy, and combinations thereof.

15. The method of claim 13, in which the anhydride curing agent is selected from the group consisting of hexahydrophthalic anhydride, methyl hexahydrophthalic anhydride, and combinations thereof.

16. The method of claim 13, in which the fluxing agent having a hydroxyl group is glycerol.

17. The method of claim 13, in which the inorganic filler is alumina.

18. The method of claim 13, in which the encapsulant material further comprises a catalyst selected from the group consisting of metal acetylacetonate and metal acetate, and in which the metal acetylacetonate and metal acetate comprise a metal ion selected from the group consisting of $Sc^{3+}$, $Cu^{2+}$, $Mo^{2+}$, $Ru^{3+}$, $Rh^{3+}$, $Cd^{2+}$, $Co^{2+}$, $Co^{3+}$, $Fe^{2+}$, $Fe^{3+}$, $Pd^{2+}$, $Pt^{2+}$, $Zn^{2+}$, and $Mg^{2+}$.

19. A microelectronic product comprising an assembly of a substrate, a flip chip having solder balls thereon, and an encapsulant surrounding and filling the solder balls and filling gaps between the solder balls, the encapsulant comprising:
  an epoxy resin selected from the group consisting of cycloaliphatic epoxy, bisphenol A epoxy, bisphenol F epoxy, epoxy novolac, biphenyl epoxy, naphthalene epoxy, dicyclopentadiene-phenol epoxy, and combinations thereof;
  an anhydride curing agent selected from the group consisting of hexahydrophthalic anhydride, methyl hexahydrophthalic anhydride, and combinations thereof;
  a catalyst;
  a fluxing agent having a hydroxyl —OH group; and
  an inorganic filler,
wherein the assembly is made by a process comprising the steps of:
  placing the flip chip with the solder balls in contact with the substrate to form a first interim assembly at a first predetermined temperature;
  providing the encapsulant to the first interim assembly and exposing the provided encapsulant material to a second predetermined temperature at which the encapsulant material is capable of flowing to surround the solder balls and fill gaps between the solder balls without undergoing curing to thereby form a second interim assembly, wherein the second temperature is lower than a melting temperature of the solder balls and not lower than the first predetermined temperature, and wherein the solder balls have not been melted prior to the provision of the encapsulant material to the first interim assembly; and
  subjecting the second interim assembly to an environment of a third predetermined temperature that is sufficient to melt the solder balls, wherein the third predetermined temperature is greater than the second predetermined temperature.

* * * * *